(12) United States Patent
Kimura et al.

(10) Patent No.: US 7,900,185 B2
(45) Date of Patent: Mar. 1, 2011

(54) PATTERN WRITING CIRCUIT SELF-DIAGNOSIS METHOD FOR CHARGED BEAM PHOTOLITHOGRAPHY APPARATUS AND CHARGED BEAM PHOTOLITHOGRAPHY APPARATUS

(75) Inventors: Hayato Kimura, Shizuoka (JP); Yujin Handa, Shizuoka (JP); Seiji Wake, Shizuoka (JP); Takuya Matsukawa, Shizuoka (JP); Seiichi Tsuchiya, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 911 days.

(21) Appl. No.: 11/754,771

(22) Filed: May 29, 2007

(65) Prior Publication Data
US 2008/0067426 A1 Mar. 20, 2008

(30) Foreign Application Priority Data
May 30, 2006 (JP) ................................. 2006-150386

(51) Int. Cl.
*G06F 17/50* (2006.01)
(52) U.S. Cl. .......... 716/139; 716/104; 716/126; 716/132
(58) Field of Classification Search .................. 716/104, 716/126, 132, 139
See application file for complete search history.

(56) References Cited

U.S. PATENT DOCUMENTS
7,485,879 B2 * 2/2009 Sunaoshi et al. ......... 250/492.22

FOREIGN PATENT DOCUMENTS
JP 10-284392 10/1998

OTHER PUBLICATIONS
U.S. Appl. No. 12/725,676, filed Mar. 17, 2010, Yashima.

* cited by examiner

*Primary Examiner* — Thuan Do
(74) *Attorney, Agent, or Firm* — Oblon, Spivak, McClelland, Maier & Neustadt, L.L.P.

(57) ABSTRACT

A pattern writing circuit self-diagnosis method for a charged beam photolithography apparatus and a charged beam photolithography apparatus which enable to maintain normality of the charged beam photolithography apparatus are provided. The pattern writing circuit self-diagnosis method for a charged beam photolithography apparatus is a pattern writing circuit self-diagnosis method for a charged beam photolithography apparatus which irradiates a charged beam on a target sample to write a desired pattern. Layout information and a pattern writing conditions which is prepared in advance are input to the pattern writing circuit, and processing result data of the pattern writing circuit output as a result of the inputting is collected. The collected processing result data of the pattern writing circuit is compared with correct data. The charged beam photolithography apparatus has means which realizes the pattern writing circuit self-diagnosis method.

20 Claims, 8 Drawing Sheets

PRIOR ART

PATTERN WRITING CIRCUIT SELF-DIAGNOSIS METHOD FOR CHARGED BEAM PHOTOLITHOGRAPHY APPARATUS AND CHARGED BEAM PHOTOLITHOGRAPHY APPARATUS

CROSS-REFERENCE TO RELATED APPLICATION

This application is based upon and claims the benefit of priority from the Japanese Patent Application No. 2006-150386, filed on May 30, 2006, the entire contents of which are incorporated herein by reference.

FIELD OF THE INVENTION

The present invention relates to a charged beam photolithography apparatus which writes a pattern of an LSI or the like on a target object such as a mask or a wafer, and more particularly, to a pattern writing circuit self-diagnosis method for a charged beam photolithography apparatus and a charged beam photolithography apparatus, which maintain the normality of the charged beam photolithography apparatus.

BACKGROUND OF THE INVENTION

A lithography technique which leads development of micropatterning of a semiconductor device is a very important and an only process which generates a pattern in semiconductor manufacturing processes. In recent years, with a high degree of integration of an LSI, a line width of circuit required for a semiconductor device is gradually miniaturized every year. In order to form a descried circuit pattern on the semiconductor device, a high-precision master pattern plate (also called a reticle or a mask) is necessary. An electron beam pattern writing technique using an electron beam (included in charged beams) has an essentially excellent resolution. For this reason, the electron beam pattern writing technique is used in production of a high-precision master plate or a mask.

Prior to pattern writing of an electron beam photolithography apparatus, a layout of a semiconductor integrated circuit serving as a base of a pattern to be written is designed, and layout data (design data) is generated. The layout data is converted to generate internal control format data for the electron beam photolithography apparatus. Furthermore, in the pattern writing circuit, the internal control format data is divided into shot data of a format of the electron beam photolithography apparatus. The shot data is written on a target object on the basis of predetermined writing conditions.

Figure 8:
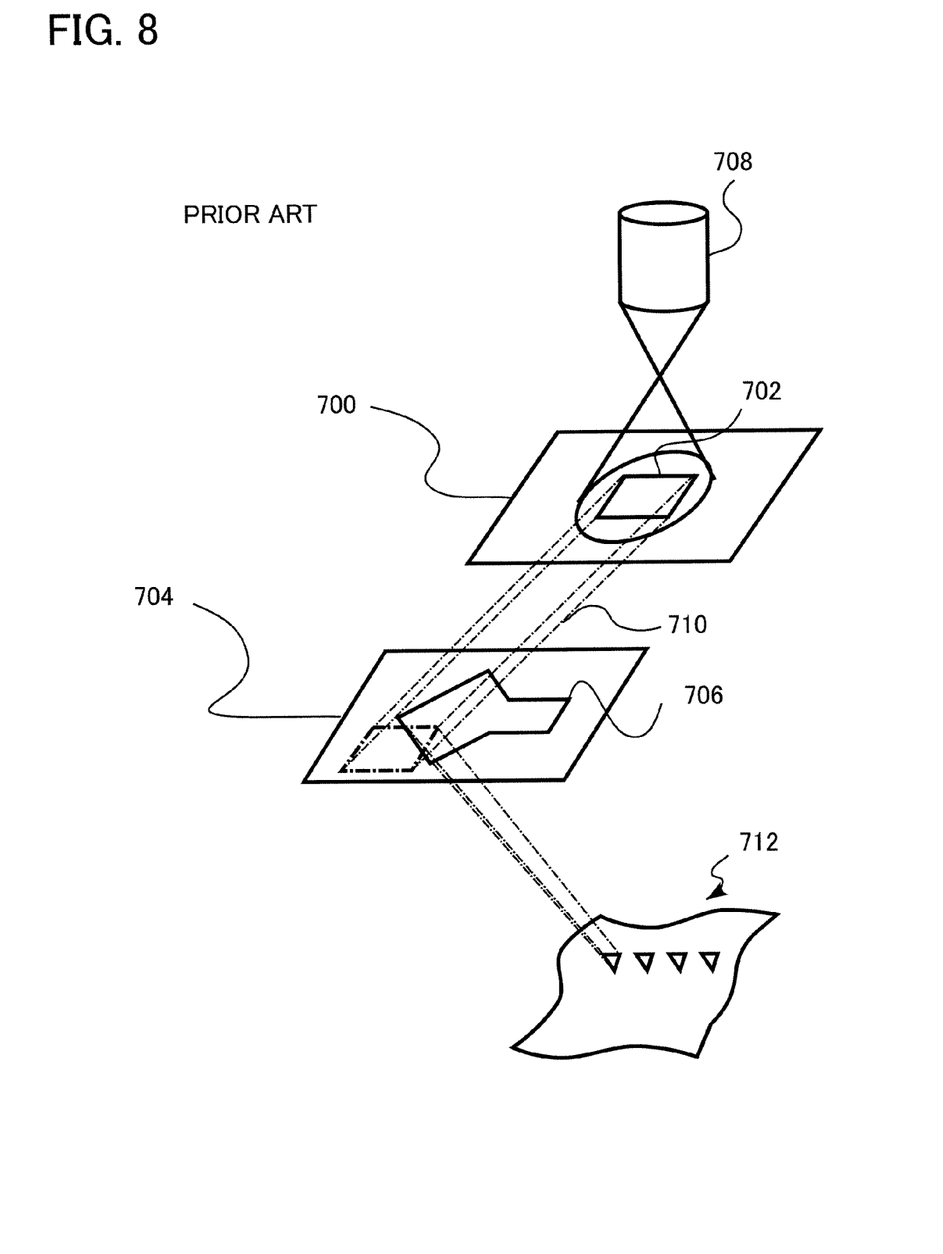
FIG. 8 is a conceptual diagram for explaining an operation of a conventional variable-shaped electron beam photolithography apparatus.

FIG. 8 is a conceptual diagram for explaining an operation of a conventional variable-shaped electron beam photolithography apparatus. An opening 702 having a rectangular shape, for example, an oblong shape to shape an electron beam is formed in a first aperture plate 700 in the variable-shaped electron beam photolithography apparatus (EB photolithography apparatus). In a second aperture plate 704 formed is, for example, an arrow-shaped variable-shaped opening 706 to shape the electron beam having passed through the opening 702 of the first aperture plate into a desired rectangular or triangular shape. An electron beam 710 emitted from a charged particle source 708 and having passed through the opening 702 of the first aperture plate is deflected by a deflector (not shown). The deflected electron beam 710 passes through a part of the variable-shaped opening 706 of the second aperture plate 704 to irradiate the electron beam on a target object 712 placed on a stage which continuously moves in a predetermined direction (for example, an X direction).

More specifically, a rectangular shape corresponding to an electron beam which can pass through both the opening 702 of the first aperture plate 700 and the variable-shaping opening 706 of the second aperture plate 704 is written in a pattern writing region of the target object 712 placed on a stage which continuously moves in the X direction. A method which causes the electron beam to pass through both the opening 702 of the first aperture plate 700 and the variable-shaping opening 706 of the second aperture plate 704 to form a variable shape is called a variable-shaped beam method.

In such a method using a variable-shaped beam, the number of exposure or shot can be made smaller than that in a method using a fixed size spot beam. For this reason, a throughput advantageously increases. As a technique which increasing a throughput, a stage continuously moving scheme is also proposed. This technique is a scheme which performs pattern writing without stopping a stage having a target object placed thereon. According to this scheme, stepping or moving time for a conventional step & repeat scheme which stops the stage during pattern writing can be deduced.

Furthermore, a so-called vector scanning scheme is also proposed which divides a region to write into small regions called sub-fields and deflects and irradiates a variable-shaped beam on only a portion on which a pattern must be written. On the other hand, a conventional one-dimensional scanning scheme scans all writing region with beam off for no-pattern are a. For this reason, an increase in throughput can be achieved (see Published Unexamined Japanese Patent Application No. 10-284392, for example).

SUMMARY OF THE INVENTION

As described above, an increase in throughput, improvement of resolution of pattern writing, and the like have been achieved in an electron beam photolithography technique. Besides the improvement of the pattern writing technique, maintenance and management of normality of the electron beam photolithography apparatus are important. More specifically, when writing of masks is continued without knowing abnormality of the electron beam photolithography apparatus, abnormal masks are continuously produced until pattern writing errors (pattern errors) of the written masks are detected by a mask inspection system, thereby resulting in tremendous damage.

As one of main causes of a pattern writing error (pattern error) which does not write a pattern designed by a user on a target object, processing abnormality in a pattern writing circuit is known. More specifically, a normal output (processing result) cannot be obtained due to a failure, a defective operation, or the like in a circuit board or an element which constitutes the pattern writing circuit. Naturally, there is no effective means which recognizes abnormality occurring in the pattern writing circuit except for means which actually writes a mask to inspect the presence/absence of a pattern writing error, and it is disadvantageously difficult to always maintain and secure the normality of the electron beam photolithography apparatus.

The present invention has been made in consideration of the above circumstances, and has as its object to provide a pattern writing circuit self-diagnosis method for a charged beam photolithography apparatus and a charged beam photolithography apparatus which enable to maintain and secure the normality of the charged beam photolithography apparatus.

A pattern writing circuit self-diagnosis method for a charged beam photolithography apparatus which irradiates a charged beam on a target object to write a desired pattern, according to one embodiment of the present invention, comprises: inputting layout information and a pattern writing condition which are prepared in advance to a pattern writing circuit; collecting processing result data of the pattern writing circuit output as a result of the inputting; and comparing the collected processing result data with correct data.

An electron beam photolithography apparatus which irradiates a charged beam on a target object to write a desired pattern, according to another embodiment of the present invention, comprises: means which inputs layout information and a pattern writing condition which are prepared in advance to a pattern writing circuit; means which collects processing result data of the pattern writing circuit output as a result of the inputting; and means which compares the collected processing result data of the pattern writing circuit with correct data.

According to the embodiments of the present invention, there can be provided a pattern writing circuit self-diagnosis method for a charged beam photolithography apparatus and a charged beam photolithography apparatus which enable to maintain the normality of the charged beam photolithography apparatus.

DETAILED DESCRIPTION OF THE EMBODIMENTS

Embodiments of a pattern writing circuit self-diagnosis method for a charged beam photolithography apparatus and a charged beam photolithography apparatus according to the present invention will be described below by using an electron beam photolithography apparatus as an example with reference to the accompanying drawings.

First Embodiment

Figure 2:
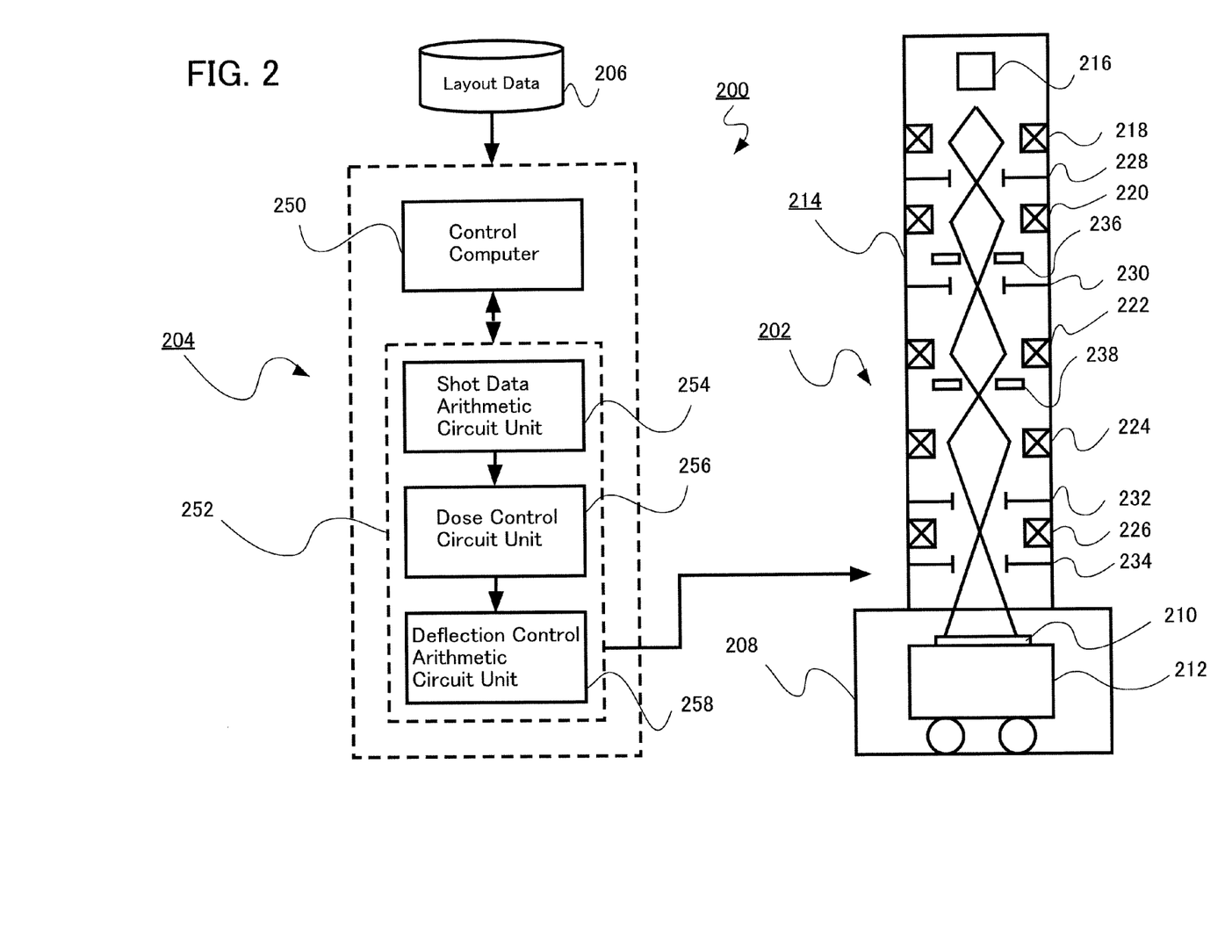
FIG. 2 is a schematic block diagram of an electron beam photolithography apparatus according to the first embodiment.

FIG. 2 is a schematic block diagram of an electron beam photolithography apparatus according to a first embodiment. An electron beam photolithography apparatus 200 is constituted by a pattern writing unit 202 and a writing control unit 204 which controls a pattern writing operation of the pattern writing unit 202. Layout data 206 (design data) of a semiconductor integrated circuit to be drawn is input and stored in advance in the electron beam photolithography apparatus 200.

In the pattern writing unit 202, a stage 212 on which a target object 210 such as a mask is placed is accommodated in a target object chamber 208. The stage 212 is driven in an X direction (left and right directions on the paper) and a Y direction (back and forth directions on the paper) by the writing control unit 204.

An electron beam optical system 214 is arranged above the target object chamber 208. The electron beam optical system 214 is constituted by an electron gun assembly 216, various lenses 218, 220, 222, 224, and 226, a blanking deflector 228, a beam size varying deflector 230, a main deflector 232 for scanning a beam, a sub-deflector 234 for scanning a beam, a first aperture plate 236 for shaping a beam to write a pattern by a variable-shaped beam, a second aperture plate 238, and the like.

In actual pattern writing, an electron beam emitted from the electron gun assembly 216 is controlled by the beam size varying deflector 230 and the first aperture plate 236 and second aperture plate 238 for shaping a beam to have a variable shape. A pattern writing process is performed by a vector scanning scheme (two-dimensional scanning scheme) and a stage continuously moving scheme.

Figure 3:
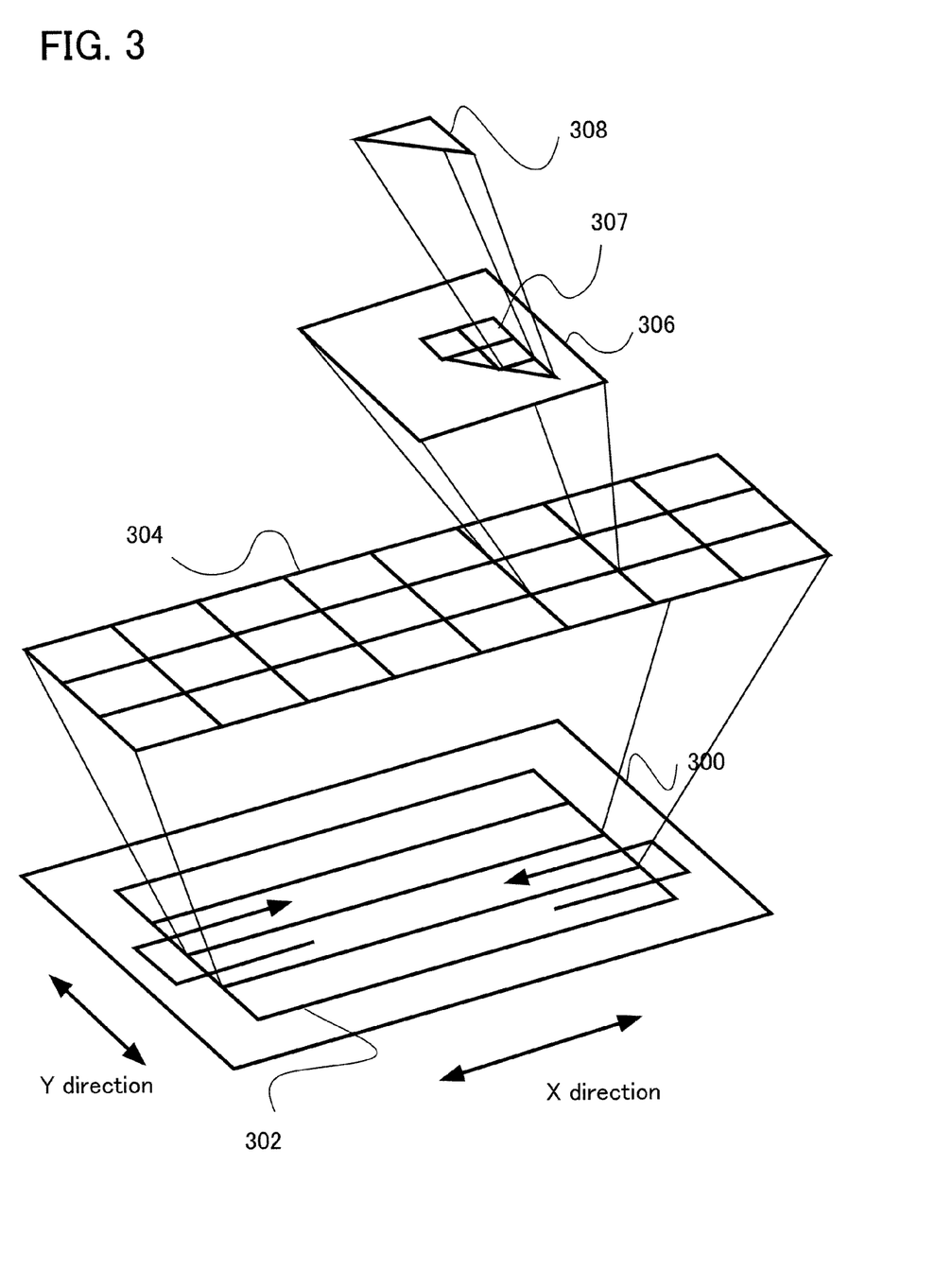
FIG. 3 is a diagram for explaining pattern writing methods of a vector scanning scheme and a stage continuously moving scheme which are employed in the first embodiment.

Now, a pattern writing process will be described below a diagram for explaining a pattern writing method using the vector scanning scheme and the stage continuously moving scheme employed in the embodiment in FIG. 3. First, a pattern 302 to be written on a target object 300 is divided into strip-shaped regions called frames 304. The frame 304 is further divided into regions called sub-fields 306. A pattern is written on only a necessary portion in the regions by deflecting a variable-shaped beam 308 shaped by the first aperture plate 236 and the second aperture plate 238 shown in FIG. 2.

A pattern writing process is performed while continuously moving the stage 212 (FIG. 2). At this time, a two-step deflector constituted by the main deflector 232 and the sub-deflector 234 (FIG. 2) is used. The sub-fields 306 are positioned by the main deflector 232 (FIG. 2) according to main deflection position data sent from a deflection control arithmetic circuit unit 258. Writing in the sub-fields 306 is performed by the sub-deflector 234 according to sub-deflection position data and shot size data also sent from the deflection control arithmetic circuit unit 258.

Upon completion of the pattern writing of one of the sub-fields 306, pattern writing of the next one of the sub-fields 306 is started. Upon completion of pattern writing of the frame 304 serving as a set of the plurality of sub-fields 306, the stage 212 which continuously moves in an X direction is moved in steps in a Y direction. The above process is repeated to sequentially write patterns on the respective frame regions. In this case, the frame 304 is a strip-shaped writing region determined by a deflection width of the main deflector 232 (FIG. 2). The sub-field 306 is a unit writing region determined by a deflection width of the sub-deflector 234 (FIG. 2).

The pattern writing control unit 204 which controls a pattern writing process of the pattern writing unit 202 will be described below with reference to FIG. 2. The pattern writing control unit 204 is constituted by a control computer 250 and a pattern writing circuit 252. The layout data 206 is converted into internal control format data unique to this electron beam photolithography apparatus by processing performed in the control computer 250. At this time, the regions of the sub-fields 306 are formed. Thereafter, the internal control format data is given to the pattern writing circuit 252 together with a pattern writing parameter file 114.

Internal control format data 112 (FIG. 1) is obtained by converting layout data including a predetermined pattern into data for the electron beam photolithography apparatus. More specifically, used are, for example, main deflection position data for specifying the frame 304 (FIG. 3) including the predetermined pattern and the sub-fields 306 (FIG. 3) and sub-deflection position data for specifying writing positions of pattern figures in the sub-fields (FIG. 3).

The pattern writing parameter file 114 (FIG. 1) is a pattern writing condition applied in a pattern writing circuit 111. Specific examples of parameters constituting the pattern writing parameter file include a pattern figure dividing parameter used in a shot data arithmetic circuit unit 254, a proximity effect correction coefficient used in a dose control circuit unit 256, a fogging effect correction coefficient, a main deflection distortion correction coefficient used in a deflection control arithmetic circuit unit 258, and a sub-deflection distortion coefficient.

The shot data arithmetic circuit unit 254 constituting the pattern writing circuit 252 divides, according to a pattern figure dividing parameter, a pattern FIG. 307 into figures each having a size and a shape which can be irradiated or shot on a target object surface by irradiating the variable-shaped beam 308 once. The pattern FIG. 307 is a pattern the size and shape of which can be arbitrarily designated by a user in the internal control format data.

The dose control circuit unit 256 adds beam irradiation time calculated from a result of proximity effect correction, fogging effect correction, and the like to each of the divided figures of the pattern FIG. 307 divided by the shot data arithmetic circuit unit 254. The addition of the beam irradiation time is performed to write more accurate patterns. The deflection control arithmetic circuit unit 258 generates control data to control the pattern writing unit 202 on the basis of an output result (processing result) from the dose control circuit unit 256 and correction coefficients such as the main deflection distortion correction coefficients and the sub-deflection distortion correction coefficients. The shot data arithmetic circuit unit 254, the dose control circuit unit 256, and the deflection control arithmetic circuit unit 258 are further divided into a plurality of circuits depending on the functions. These writing circuits have memories called maintenance memories in which processing result data obtained by the respective circuits are temporarily stored.

In this case, when the layout data and a pattern writing parameter are designated, normally pattern writing circuits always runs in an exactly same manner and the processing results are same. In contrast to this, when the processing results are not the same, the circuits are abnormal. The processing results can also be calculated by simulation using the layout data and the pattern writing parameter. The results obtained by the simulation are also called simulation result data.

As will be described later, the electron beam photolithography apparatus 200 has a pattern writing circuit self-diagnosis function for an electron beam photolithography apparatus which makes it possible to maintain and secure the normality of a charged beam photolithography apparatus. The electron beam photolithography apparatus 200 includes means which realizes the self-diagnosis function as a characteristic feature.

Now, the pattern writing circuit self-diagnosis method for an electron beam photolithography apparatus according to the embodiment will be described below. The pattern writing circuit self-diagnosis method for an electron beam photolithography apparatus according to the embodiment includes, as characteristic features, the step of inputting layout information and a pattern writing condition which are prepared in advance to a pattern writing circuit to collect processing result data of the pattern writing circuit output as a result of the inputting, and the step of comparing the collected processing result data of the pattern writing circuit with correct data output by processing the same layout data in advance and causing the data to flow into the pattern writing circuit under the same pattern writing circuit and checked about normality to diagnose the pattern writing circuit.

Figure 1:
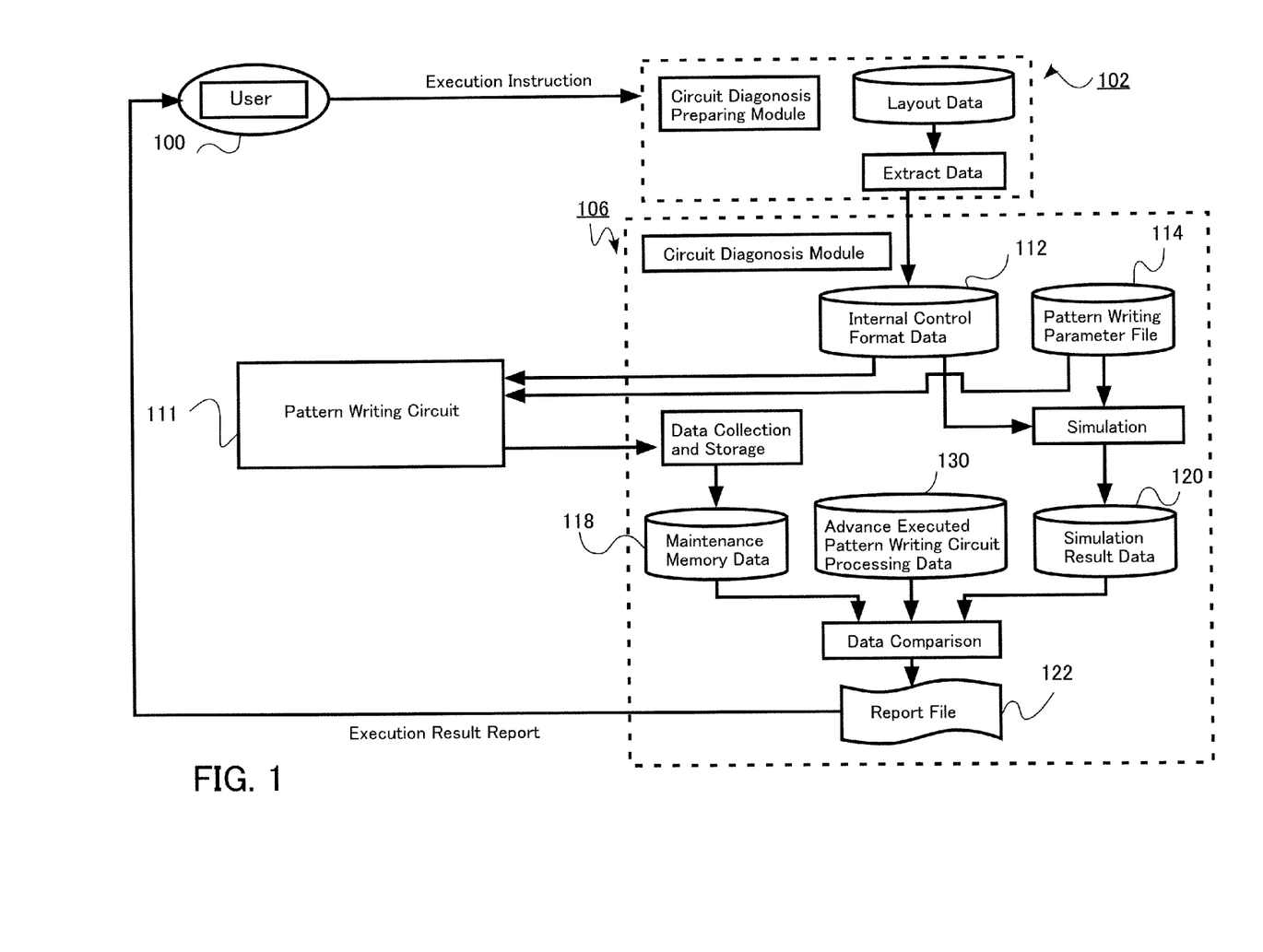
FIG. 1 is an operational diagram of a pattern writing circuit self-diagnosis mechanism which realizes a pattern writing circuit self-diagnosis method according to a first embodiment.

FIG. 1 is an operational diagram of a pattern writing circuit self-diagnosis mechanism which realizes a pattern writing circuit self-diagnosis method according to the embodiment. The pattern writing circuit self-diagnosis mechanism is constituted by two modules, i.e., a circuit diagnosis preparing module 102 and a circuit diagnosis module 106. In this manner, the pattern writing circuit self-diagnosis mechanism is divided into two modules to clarify the roles of the modules, thereby simplifying pattern writing circuit self-diagnosis.

In this case, the circuit diagnosis preparing module 102 is a module which automatically performs preparation to operate the circuit diagnosis module 106 serving as a main body of the pattern writing circuit self-diagnosis mechanism according to an instruction from a user 100. The circuit diagnosis preparing module 102 also has a function of outputting a pattern writing circuit self-diagnosis result of the circuit diagnosis module 106.

The circuit diagnosis module 106 serving as the main body of the pattern writing circuit self-diagnosis mechanism is a module which collects processing result data (maintenance memory data 118) of the pattern writing circuit at a position desired by a user by using layout data selected by the user 100 to diagnose the presence/absence of abnormality of the pattern writing circuit. Although the layout data which is externally input data includes various formats, a self-diagnosis process of the pattern writing circuit performed by the pattern writing circuit self-diagnosis mechanism does not depend on the types of the formats.

The diagnosis function obtained by the pattern writing circuit self-diagnosis mechanism is practically executed by software stored in the control calculator 250 in the pattern writing control unit 204 or a combination of the software and hardware arranged in the pattern writing control unit 204.

An outline of a pattern writing circuit self-diagnosis method using the pattern writing circuit self-diagnosis mechanism will be described below with reference to FIG. 1. When the user 100 tries to execute self-diagnosis of the pattern writing circuit, the user 100 first sends an execution instruction of pattern writing circuit self-diagnosis to the circuit diagnosis preparing module 102. The user 100 designates layout data for use in pattern writing circuit self-diagnosis displayed by the circuit diagnosis preparing module 102. The circuit diagnosis module 106 starts a pattern writing circuit 111 to cause the layout data to flow. A circuit process is stopped at coordinates of a position designated by the user 100. In this manner, the maintenance memory data 118 to be compared with correct data can be collected.

The maintenance memory data 118 obtained as described above is compared with the correct data. The correct data is processing result data (advance executed pattern writing circuit processing result data 130) of the pattern writing circuit obtained by causing the same layout data to flow into the pattern writing circuit in advance and storing the layout data with checked normality. This allows the normality of the pattern writing circuit 111 to be diagnosed. The comparison result is edited and stored in a report file 122 and reported to the user 100.

In the pattern writing circuit self-diagnosis, pattern writing is not necessarily performed on an actual target object, and for example, so-called virtual pattern writing may be performed by starting only the pattern writing circuit. The normality of the correct data can be confirmed by checking a mask written when the correct data was acquired by mask inspection system. Alternatively, the normality can be checked by comparing the correct data with simulation result data.

Figure 4:
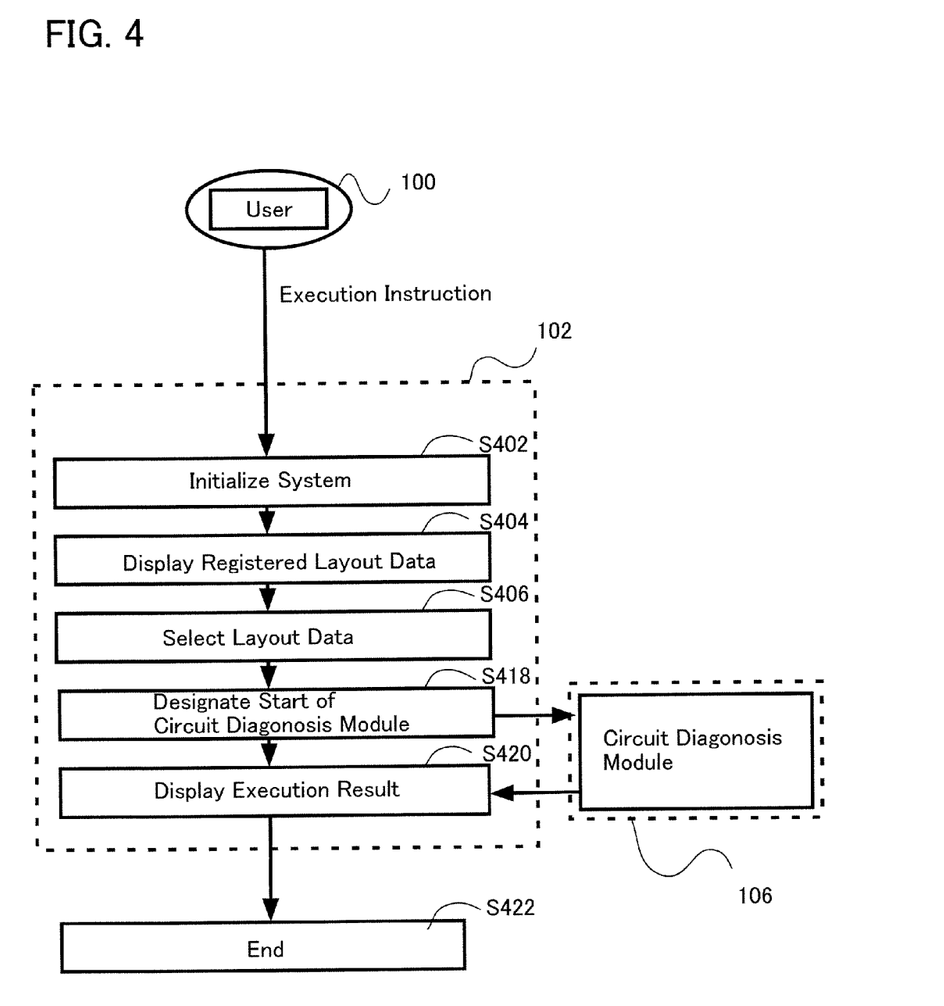
FIG. 4 is a block diagram of operation steps of a circuit diagnosis preparing module according to the first embodiment.

Subsequently, operation steps in the circuit diagnosis preparing module 102 will be described below in detail with reference to FIG. 4. When the user 100 tries to execute self-diagnosis of the pattern writing circuit, the user 100 first issues an execution instruction to perform pattern writing self-diagnosis to the circuit diagnosis preparing module 102. The execution instruction is performed, for example, by operating input means such as an input terminal connected to the electron beam photolithography apparatus. The circuit diagnosis preparing module 102 performs system initialization such as check for a free area of a work directory in the control calculator 250 (FIG. 2) in response to the execution instruction issued by the user 100 (S402).

The circuit diagnosis preparing module 102 displays a list of layout data having correct data which has been registered for pattern writing circuit self-diagnosis to the user 100 (S404). In this case, the layout data for use in pattern writing circuit self-diagnosis is not limited to its data format and pattern. However, as the layout data, layout data suitable for the pattern writing circuit self-diagnosis is desired. More specifically, layout data constituted by a pattern having a limit condition of the electron beam photolithography apparatus and layout data including a pattern in which a pattern writing error occurred in the past is preferably used to improve the sensitivity of the pattern writing circuit self-diagnosis.

The user 100 selects layout data to be used from the displayed list of the registered correct data (S406). The user 100 issues a start designation to the circuit diagnosis module 106 (S418). Fin ally, an execution result of the circuit diagnosis module 106 is read, and the execution result is displayed on display means such as a display device (S420) to end the operation (S422).

Figure 5:
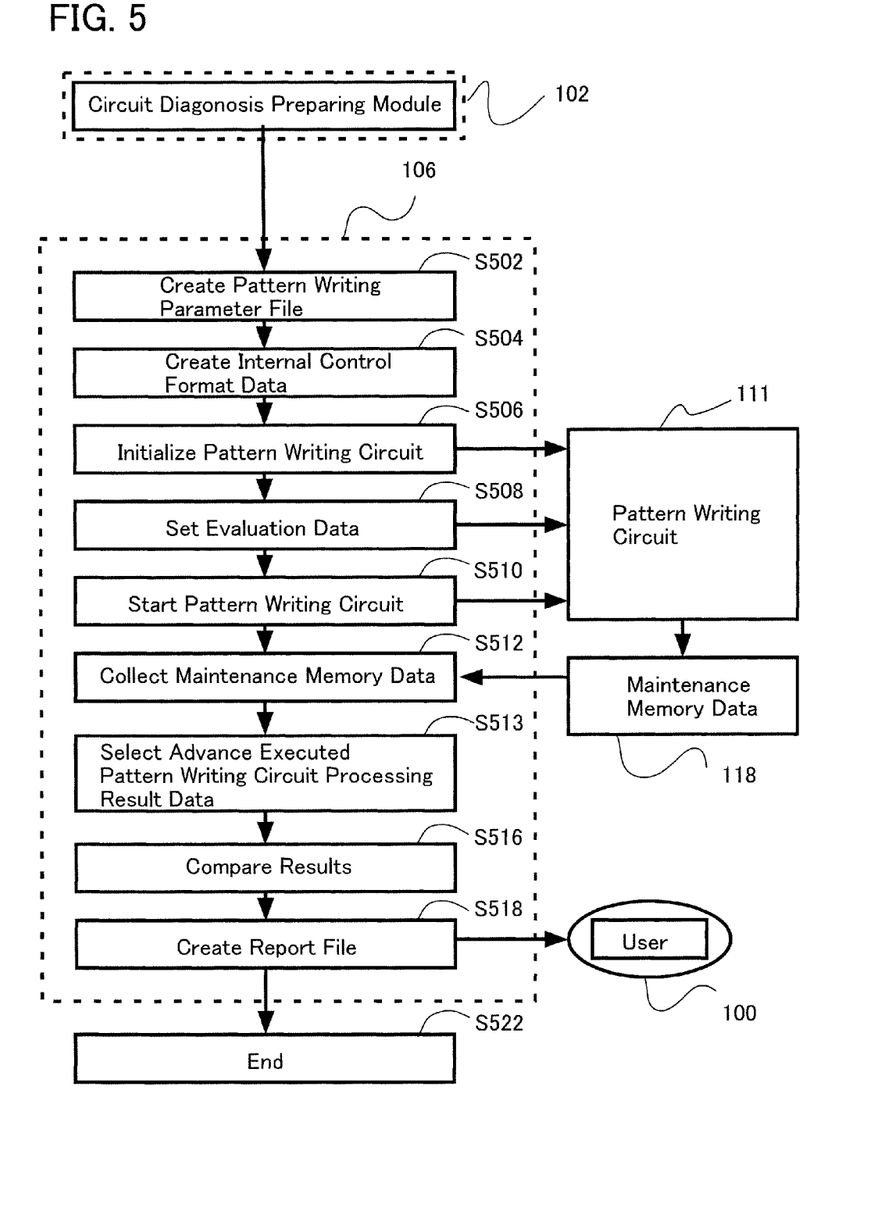
FIG. 5 is a block diagram of operation steps of a circuit diagnosis module according to the first embodiment.

Subsequently, operation steps in the circuit diagnosis module 106 will be described below in detail with reference to FIG. 5. On the basis of the layout data selected by the user 100 according to the designation of the circuit diagnosis preparing module 102, a pattern writing parameter which gives a pattern writing condition to the pattern writing circuit and internal control format data which gives layout information (also collectively called evaluation data) are created (S502 and S504). When internal control format data 112 and a pattern writing parameter 114 are stored in the control calculator 250, an external storage, and the like, the internal control format data 112 and the pattern writing parameter 114 can also be directly used as input data of the circuit diagnosis module 106.

The circuit diagnosis module 106 inspects coordinates of positions of patterns recorded in data when the internal control format data 112 is created. When correct data is previously created, data of a pattern portion written before a pattern at pattern writing circuit stop coordinates or coordinates designated by the user is extracted. In this case, the correct data is the advance executed pattern writing circuit processing result data 130 (FIG. 1) previously obtained by causing the internal control format data to flow. This processing is performed to stop the processing of the pattern writing circuit near arbitrary coordinates, and the maintenance memory data 118 which is the pattern writing circuit processing result data can be obtained from the maintenance memory of the pattern writing circuit.

Upon completion of creation of the internal control format data (S504), the circuit diagnosis module 106 initializes the pattern writing circuit 111 (S506). After the initialization, the pattern writing parameter file serving as the evaluation data and the internal control format data are set (S508), and the pattern writing circuit 111 is started (S510).

When the pattern writing parameter file and the internal control format data flow into the pattern writing circuit 111, the maintenance memory data 118 of the pattern writing circuit 111 is collected (S512). Since a pattern writing process is stopped near the stop coordinates input or designated in advance, the maintenance memory data 118 is maintenance memory data at the same position as that of the advance executed pattern writing circuit processing result data 130 acquired in advance. In this case, the maintenance memory which holds the maintenance memory data 118 is generally arranged each of a plurality of circuits constituting the shot data arithmetic circuit unit 254, the dose control circuit unit 256, and the deflection control arithmetic circuit unit 258 (FIG. 2) which are included in the pattern writing circuit 111. The maintenance memories temporarily hold processing result data obtained from respective circuit boards.

Upon completion of the maintenance memory data 118, the circuit diagnosis module 106 acquires the advance executed pattern writing circuit processing result data serving as correct data (S513). The advance executed pattern writing circuit processing result data is obtained by collecting processing result data when the layout data is previously caused to flow. For this reason, the data format of the advance executed pattern writing circuit processing result data is the same as that of the maintenance memory data 118 to be compared.

Then, the collected maintenance memory data 118 is compared with the advance executed pattern writing circuit processing result data serving as the correct data (S516). In order to enable a user to easily recognize the comparison result, a report file is created (S518), and the operation is ended (S522). Data comparing results of respective circuit boards constituting the pattern writing circuit 111 are output to the report file. If the data are different from each other, the circuit diagnosis module 106 informs the user that the circuit board is abnormal. The report file is displayed on display means, for example, a monitor display.

In the embodiment, it is assumed that the circuit process is stopped at coordinates of a designated position to collect maintenance memory data. The method is especially effective when the capacity of the maintenance memory is small for an amount of obtained processing result data of the pattern writing circuit. Naturally, the circuit process is not necessarily stopped on the way. When the capacity of the maintenance memory is relatively larger than the amount of processing result data of the pattern writing circuit, it is not excluded to execute a pattern writing process without stopping the pattern writing process on the way.

A method of collecting the maintenance memory data 118 at a specific position is not limited to extraction of data performed by comparing designated coordinates by the circuit diagnosis module 106. In addition to this, a method which extracts data of a specific sub-field to the number of pattern figures may be used. Alternatively, a method is available which sets a specific pattern writing parameter to stop the pattern writing circuit itself by the designated coordinates or the specific sub-field and the number of pattern figures in the circuit diagnosis module 106. Alternatively, a method is also available which sequentially monitors the contents of the maintenance memory of the pattern writing circuit, confirms that the processing reaches the specific coordinates or the specific sub-field and the number of pattern figures, and then forcibly immediately stops the processing of the pattern writing circuit.

The embodiment has described an aspect in which the processing result data of the pattern writing circuit is stored as the maintenance memory data 118 in the maintenance memory arranged in the pattern writing circuit. However, the method of storing the processing result data of the pattern writing circuit is not limited to the aspect. For example, an aspect in which processing result data on all circuit boards are stored in a storing apparatus arranged outside the photolithography apparatus at once may be used.

When a mask to be evaluated is written by multi-pass pattern writing, collection of the maintenance memory data 118 related to a plurality of pattern writing operations and comparison with the correct data may be performed by one process. In this case, the multi-pass pattern writing is a technique which reduces a random error and a systematic error in shaping or position ing of an electron beam to improve mask writing accuracy. More specifically, the multi-pass pattern writing means that the same pattern is written twice or more, while shifting a pattern writing region.

The embodiment is especially effective in the electron beam photolithography apparatus using the variable-shaped beam scheme, the vector scanning scheme, or the stage continuously moving scheme. For this reason, this case is described. However, the embodiment is also effective in an electron beam photolithography apparatus to which a step & repeat scheme or the like is applied. Therefore, the embodiment is not limited to the electron beam photolithography apparatus using the variable-shaped beam scheme, the vector scanning scheme, or the stage continuously moving scheme. Although layout data handled by the electron beam photolithography apparatus may have variable data formats, the operation of the embodiment does not depend on the types of data formats.

In a prior art, there is no means which recognizes abnormality occurring in the pattern writing circuit, and it is difficult to always maintain the normality of the electron beam photolithography apparatus. According to the embodiment, by using evaluation data about a pattern suitable for pattern writing evaluation prepared in advance, the obtained maintenance memory data is prepared. The advance executed pattern writing circuit processing result data confirmed as normal data in advance and collected from the maintenance memory is prepared as correct data. The maintenance memory data obtained from the evaluation data is automatically compared with the correct data to enable to rapidly evaluate the presence/absence of abnormality of the pattern writing circuit.

The maintenance memory data output from the circuits constituting the pattern writing circuit can be verified. Therefore, even though abnormality occurs, a circuit board in which the abnormality occurs can be practically specified. For this reason, fixing abnormality can be rapidly made.

Since abnormality of the pattern writing circuit can be detected before an actual pattern writing error is detected by inspection of a target object after the pattern writing, abnormality of the apparatus can be rapidly diagnosed. As a consequence, even though abnormality occurs in the apparatus, an amount of damage can be suppressed.

As described above, according to the embodiment, it becomes possible to provide a pattern writing circuit self-diagnosis method for an electron beam photolithography apparatus and an electron beam photolithography apparatus which enable to maintain the normality of the electron beam photolithography apparatus.

First Modification of First Embodiment

A first modification of the first embodiment will be described below. The first modification is different from the first embodiment in that simulation result data 120 (FIG. 1) is prepared as correct data and compared without using the advance executed pattern writing circuit processing result data 130 (FIG. 1) prepared in advance as the correct data.

Figure 6:
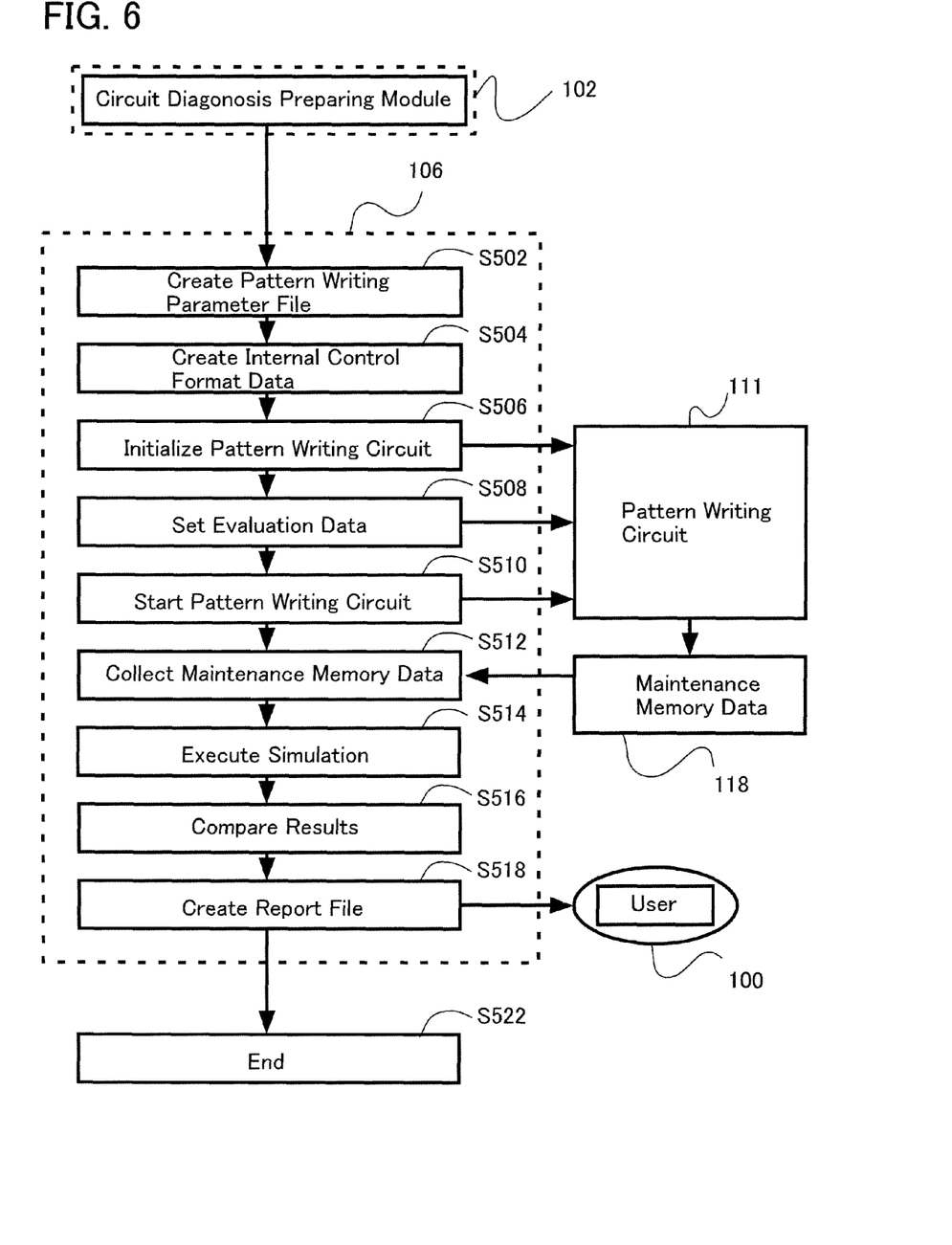
FIG. 6 is a block diagram of operation steps of a circuit diagnosis module according to a first modification of the first embodiment.

FIG. 6 is a diagram for explaining operation steps of a circuit diagnosis module 106 according to the modification. A user 100 inputs in advance a position of a desired pattern, i.e., position coordinates at which processing of the pattern writing circuit is desired to be stopped. The circuit diagnosis module 106 cuts layout data so as to stop the processing of the pattern writing circuit near the stop coordinate position designated by the user 100 in advance when selected evaluation data is set (S508). In the modification, since the steps up to the step (S512) of collecting maintenance memory data 118 are the same as those in the first embodiment, a description of the steps will be omitted.

After the maintenance memory data 118 is collected (S512), the circuit diagnosis module 106 executes simulation of a pattern writing process in the pattern writing circuit 111 in order to create correct data on the basis of layout data selected by a user (S514). At this time, in this simulation, a necessary part of the layout data or internal control format data is extracted in accordance with a size of a minimum maintenance memory required to be compared with the maintenance memory data 118 in such a manner that the processing is stopped near a designated stop coordinate position. Simulation result data output from circuits constituting the pattern writing circuit 111 is output in the same data format as that of the actual maintenance memory data 118.

The collected maintenance memory data 118 is compared with the simulation result data (S516). Thereafter, a report file is created so as to enable the user to easily recognize a comparison result (S518) and the operation is ended (S520) as in the embodiment.

Since the electron beam photolithography apparatus and the pattern writing circuit self-diagnosis method except for the above description are the same as those in the first embodiment, a description thereof will be omitted.

In this manner, when the simulation result data is used as correct data, correct data can be created every pattern writing circuit self-diagnosis by using an arbitrary pattern in layout data prepared in advance. Accordingly, various layouts such as a layout for a white test according to the operation specifications of a pattern writing circuit 252 and a pattern which causes a pattern writing error previously caused by abnormality of the pattern writing circuit 252 are used to allow abnormality detection accuracy of the pattern writing circuit to be improved.

The simulation to obtain correct data may not necessarily performed after the collection of the maintenance memory data as shown in FIG. 6. For example, the simulation may be performed before the start of the pattern writing circuit or may be parallel performed during the operation of the pattern writing circuit.

Second Modification of First Embodiment

In this modification, internal control format data which gives layout information and a pattern writing parameter file which gives a pattern writing condition are designed according to an internal configuration of the pattern writing circuit. More specifically, it is characterized in that as the evaluation data used are layout information and a pattern writing condition which are designed in consideration of an internal configuration and a control flow, dedicated to detection of pattern writing circuit abnormality, and optimized for pattern writing circuit diagnosis. Since the second modification is the same as the first embodiment except for the characteristic, a description thereof will be omitted.

Examples of the layout information and the pattern writing condition which are optimized for pattern writing circuit diagnosis and dedicated to detection of pattern writing circuit abnormality include data which entirely passes through all processing divergent pathways in the pattern writing circuit or data which is entirely read and written at all addresses of a memory mounted on the pattern writing circuit. When the layout information and the pattern writing condition which are dedicated to detection of pattern writing abnormality are caused to flow in the pattern writing circuit as evaluation data, a problem which may occur in the pattern writing circuit can be efficiently extracted.

Second Embodiment

A second embodiment of the present invention will be described below. Since the embodiment is the same as the first embodiment and the modifications of the first embodiment except that pattern writing circuit self-diagnosis is periodically performed (will be described later), a description thereof will be omitted.

The embodiment is characterized in that the pattern writing circuit self-diagnosis is periodically performed. For example, upon completion of the predetermined number of times of pattern writing or after elapse of a predetermined accumulated pattern writing time, evaluation data prepared by a user in advance, i.e., internal control format data and a pattern writing parameter file are caused to flow. Maintenance memory data 118 (FIG. 1) is automatically compared with advance executed pattern writing circuit processing result data 130 (FIG. 1) or simulation result data 120 serving as correct data to diagnose the presence/absence of abnormality in the pattern writing circuit. In particular, from the viewpoint that abnormality is early detected, pattern writing circuit self-diagnosis is preferably performed every pattern writing process for one target object.

The pattern writing circuit self-diagnosis may not necessarily performed when the entire electron beam photolithography apparatus is stopped. For example, when evaluation data is caused to flow at a timing when the pattern writing circuit does not operate such as during loading or unloading of a mask to and from the apparatus main body, the pattern writing circuit can be self-diagnosed without deteriorating an operating rate of the electron beam photolithography apparatus.

In this manner, periodically performing the pattern writing circuit self-diagnosis enables abnormality of the pattern writing circuit to be reliably detected. When abnormality is detected in the periodical pattern writing circuit self-diagnosis, an operation is performed which adds abnormal information to a pattern writing report of a mask written after the previous pattern writing circuit self-diagnosis, so that quality management of the mask can be strengthened. Furthermore, when pattern writing circuit self-diagnosis is performed every pattern writing process, a mask in which a pattern writing error highly probably occurs is only a mask obtained immediately before diagnosis. For this reason, even though abnormality occurs in the pattern writing circuit, damage can be minimized.

Modification of Second Embodiment

In a modification of the second embodiment of the present invention, prepared are a plurality of sets of different combinations of layout information and pattern writing conditions which easily cause errors in a pattern writing circuit. Each time the diagnosis is periodically performed, the sets are sequentially input to the pattern writing circuit one by one. The modification is characterized in that a plurality of different evaluation data (internal control format data and pattern writing parameter files) or an evaluation data sets are prepared in advance, and one of the evaluation data or one of the evaluation data sets are sequentially caused to flow in the periodical pattern writing circuit self-diagnosis.

When a plurality of evaluation data sets (combinations of internal control format data and a pattern writing parameter file) which easily cause errors in the pattern writing circuit are present, all the evaluation data sets are caused to flow in all periodical pattern writing circuit self-diagnoses to enable abnormality detection accuracy to be improved. For this reason, the configuration is desired from the viewpoint of pattern writing circuit self-diagnosis.

However, long time is required to cause all the evaluation data to flow, and an operating rate of the electron beam photolithography apparatus is deteriorated. Therefore, as in the modification of the embodiment, evaluation data sets which easily cause an error in the pattern writing circuit are prepared in advance. The evaluation data sets are sequentially caused to flow one by one in the periodical pattern writing circuit self-diagnosis to allow a decrease in operating rate of the apparatus to be suppressed. A diagnosis performed by all the evaluation data can be covered with the periodical pattern writing circuit self-diagnosis performed twice or more. In this manner, the abnormality detection accuracy can be advantageously maintained.

Third Embodiment

A third embodiment of the present invention will be described below. An electron beam photolithography apparatus according to the third embodiment includes a redundant data path system, i.e., two pattern writing circuits having the same configurations in the electron beam photolithography apparatus.

Figure 7:
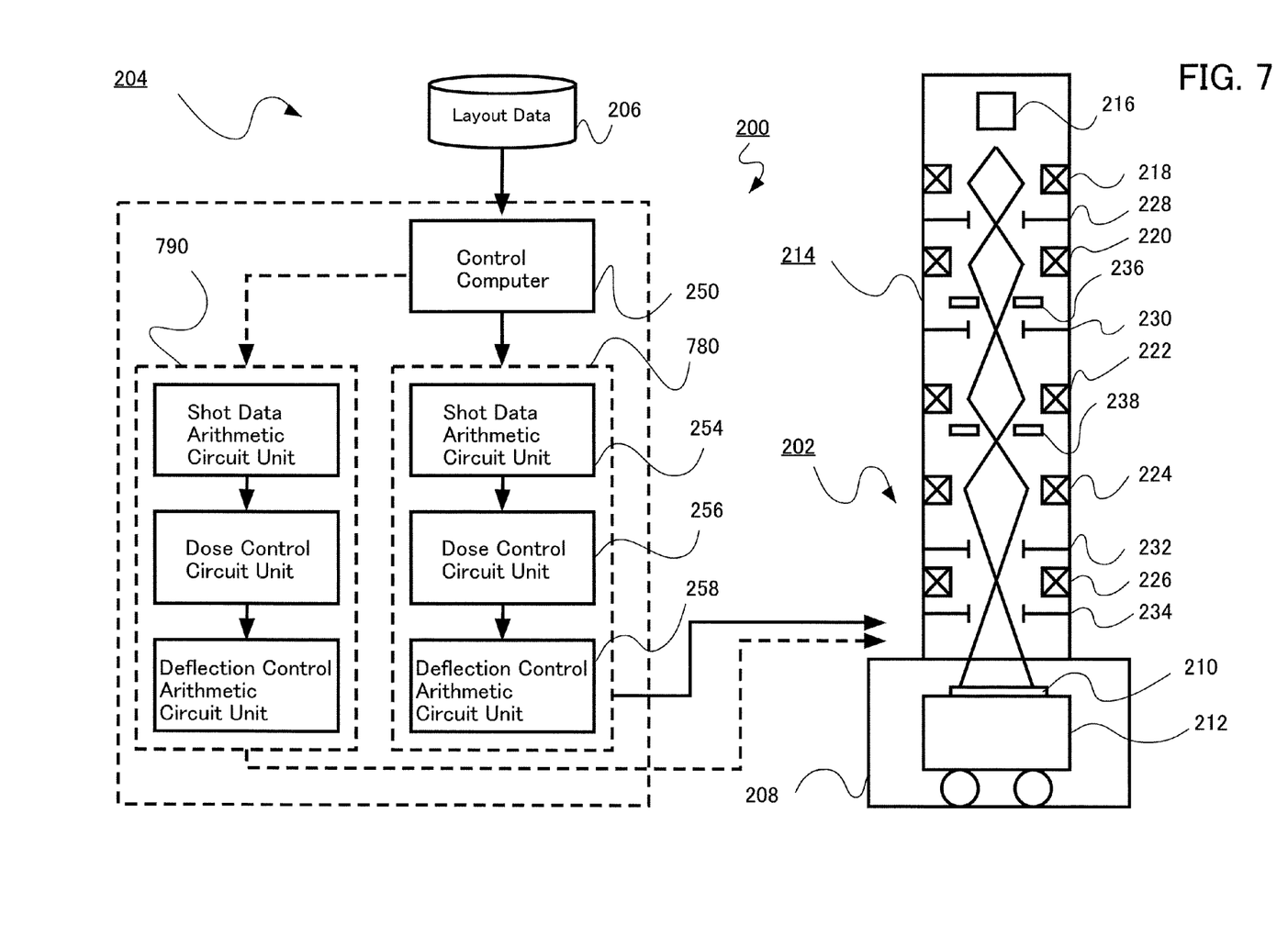
FIG. 7 is a schematic block diagram of an electron beam photolithography apparatus according to a third embodiment.

FIG. 7 is a schematic block diagram of the electron beam photolithography apparatus according to the third embodiment. As shown in FIG. 3, a pattern writing control unit 204 of an electron beam photolithography apparatus 200 is characterized by including a first pattern writing circuit 780 and a second pattern writing circuit 790.

It is assumed that, in a pattern writing circuit self-diagnosis, evaluation data is caused to flow into the first pattern writing circuit 780 to find abnormality in a pattern writing circuit. In this case, the same evaluation data is also caused to flow into the second pattern writing circuit 790 equivalent to the first pattern writing circuit 780. When normality is confirmed, the first pattern writing circuit 780 is separated, and an actual mask writing process is performed by using the second pattern writing circuit 790.

In this manner, the two same pattern writing circuits are arranged in the electron beam photolithography apparatus to enable an operation of performing a pattern writing process by using the other pattern writing circuit when abnormality is found in one pattern writing circuit. Accordingly, time for stopping the electron beam photolithography apparatus can be minimized, and an operating rate of the electron beam photolithography apparatus can be advantageously maximized.

The embodiments of the present invention and the modifications of the embodiments have been described with reference to specific examples. In the descriptions of the embodiments and modifications, descriptions of parts or the like which are not directly required to explain the present invention are omitted in the pattern writing circuit self-diagnosis method for a charged beam photolithography apparatus and the charged beam photolithography apparatus. However, required elements related to the pattern writing circuit self-diagnosis method for a charged beam photolithography apparatus and the charged beam photolithography apparatus can be appropriately selected and used.

All writing error diagnosis methods for charged beam photolithography apparatuses and all charged beam photolithography apparatuses which include the elements of the present invention and which can be appropriately changed in design by a person skilled in the art are included in the spirit and scope of the invention.

What is claimed is:

1. A pattern writing circuit self-diagnosis method for a charged beam photolithography apparatus, the apparatus irradiating a charged beam on a target object to write a desired pattern, comprising:
   inputting layout information and a pattern writing condition to a pattern writing circuit configured to control a pattern writing process, the layout information and the pattern writing condition being prepared in advance;
   processing, via a processor, the pattern writing circuit;
   collecting processing result data of the pattern writing circuit output as a result of the inputting and the processing;
   comparing the collected processing result data with correct data; and
   diagnosing normality of the pattern writing circuit.

2. The pattern writing circuit self-diagnosis method for a charged beam photolithography apparatus according to claim 1, wherein
   the layout information and the pattern writing condition are designed according to an internal configuration of the pattern writing circuit and dedicated to detection of pattern writing abnormality.

3. The pattern writing circuit self-diagnosis method for a charged beam photolithography apparatus according to claim 1, wherein
   the correct data is processing result data of the pattern writing circuit, the processing of the pattern writing circuit is executed in advance.

4. The pattern writing circuit self-diagnosis method for a charged beam photolithography apparatus according to claim 1, further comprising, after the collected processing result data is compared with the correct data, periodically repeating the operations of:
   inputting layout information and a pattern writing condition to the pattern writing circuit, the layout information and a pattern writing condition are prepared in advance;
   collecting the processing result data of the pattern writing circuit output as a result of the inputting; and
   comparing the collected processing result data with correct data.

5. The pattern writing circuit self-diagnosis method for a charged beam photolithography apparatus according to claim 4, further comprising:
   preparing a plurality of sets of different combinations of layout information and pattern writing conditions; and
   when periodically repeating the operations of:
   inputting layout information and a pattern writing conditions to the pattern writing circuit, the layout information and pattern writing conditions are prepared in advance;
   collecting processing result data of the pattern writing circuit output as a result of the inputting; and
   comparing the collected processing result data with correct data,
   sequentially inputting the plurality of sets one by one as the layout information and the pattern writing condition.

6. The pattern writing circuit self-diagnosis method for a charged beam photolithography apparatus according to claim 1, wherein
   the layout information is data obtained in such a manner that layout data including a desired pattern is converted for the charged beam photolithography apparatus.

7. The pattern writing circuit self-diagnosis method for a charged beam photolithography apparatus according to claim 1, further comprising:
   in the case where the charged beam photolithography apparatus includes a second pattern writing circuit having the same configuration as that of the pattern writing circuit,
   when the comparison result is determined as an abnormal result,
   inputting layout information and a pattern writing condition to the second pattern writing circuit, the layout information and the pattern writing condition are prepared in advance;
   collecting processing result data of the second pattern writing circuit output as a result of the inputting; and
   comparing the collected processing result data of the second pattern writing circuit with the correct data.

8. The pattern writing circuit self-diagnosis method for a charged beam photolithography apparatus according to claim 1, wherein
   the correct data is simulation result data processed in the charged beam photolithography apparatus.

9. The pattern writing circuit self-diagnosis method for a charged beam photolithography apparatus according to claim 1, wherein
   when the pattern writing circuit is constituted by a plurality of circuit boards, collection of the processing result data and comparison between the processing result data and the correct data are performed for each of the circuit boards.

10. The pattern writing circuit self-diagnosis method for a charged beam photolithography apparatus according to claim 1, wherein
    the processing result data of the pattern writing circuit is collected by storing the processing result data of the pattern writing circuit in storage means and reading the processing result data stored in the storage means.

11. The pattern writing circuit self-diagnosis method for a charged beam photolithography apparatus according to claim 1, wherein
    the charged beam is an electron beam.

12. An electron beam photolithography apparatus, the apparatus irradiating a charged beam on a target object to write a desired pattern, comprising:
    means for inputting layout information and a pattern writing condition to a pattern writing circuit to control a pattern writing process, the layout information and the pattern writing condition being prepared in advance;
means for processing the pattern writing circuit;
means for collecting processing result data of the pattern writing circuit output as a result of the inputting and the processing;
means for comparing the collected processing result data of the pattern writing circuit with correct data; and
means for diagnosing normality of the pattern writing circuit.

13. The charged beam photolithography apparatus according to claim 12, wherein
the layout information and the pattern writing condition are designed according to an internal configuration of the pattern writing circuit and dedicated to detection of pattern writing abnormality.

14. The charged beam photolithography apparatus according to claim 12, wherein
the correct data is processing result data of the pattern writing circuit, the processing of the pattern writing circuit is executed in advance.

15. The charged beam photolithography apparatus according to claim 12, wherein
the layout information is data obtained in such a manner that layout data including a desired pattern is converted for the charged beam photolithography apparatus.

16. The charged beam photolithography apparatus according to claim 12, comprising:
in the case where the charged beam photolithography apparatus includes a second pattern writing circuit having the same configuration as that of the pattern writing circuit,
when the comparison result is determined as an abnormal result,
input means for inputting layout information and a pattern writing condition to the second pattern writing circuit, the layout information and the pattern writing condition are prepared in advance;
collecting means for collecting processing result data of the second pattern writing circuit output as a result of the inputting; and
comparing means for comparing the collected processing result data of the second pattern writing circuit with the correct data.

17. The charged beam photolithography apparatus according to claim 12, wherein
the correct data is simulation result data processed in the charged beam photolithography apparatus.

18. The charged beam photolithography apparatus according to claim 12, wherein
when the pattern writing circuit is constituted by a plurality of circuit boards, collection of the processing result data and comparison between the processing result data and the correct data are performed for each of the circuit boards.

19. The charged beam photolithography apparatus according to claim 12, wherein
the collecting means includes storage means for storing the processing result data of the pattern writing circuit, and reading means for reading the processing result data stored in the storage means.

20. The charged beam photolithography apparatus according to claim 12, wherein
the charged beam is an electron beam.

* * * * *